(12) United States Patent
Wen et al.

(10) Patent No.: US 10,990,215 B2
(45) Date of Patent: Apr. 27, 2021

(54) INTEGRATING CIRCUIT AND CAPACITANCE SENSING CIRCUIT

(71) Applicant: Shenzhen Goodix Technology Co., Ltd., Guangdong (CN)

(72) Inventors: Ya-Nan Wen, Taipei (TW); Fu-Chiang Yang, Taipei (TW); Yingsi Liang, Guangdong (CN)

(73) Assignee: Shenzhen Goodix Technology Co., Ltd., Guangdong (CN)

( * ) Notice: Subject to any disclaimer, the term of this patent is extended or adjusted under 35 U.S.C. 154(b) by 129 days.

(21) Appl. No.: 15/690,296

(22) Filed: Aug. 30, 2017

(65) Prior Publication Data

US 2017/0364180 A1 Dec. 21, 2017

Related U.S. Application Data

(63) Continuation of application No. PCT/CN2016/113974, filed on Dec. 30, 2016.

(30) Foreign Application Priority Data

Dec. 31, 2015 (CN) .......................... 201511031728.1

(51) Int. Cl.
  *G06F 3/044* (2006.01)
  *H03F 3/00* (2006.01)
  *G06F 3/041* (2006.01)

(52) U.S. Cl.
  CPC ............ *G06F 3/0416* (2013.01); *G06F 3/044* (2013.01); *H03F 3/005* (2013.01)

(58) Field of Classification Search
  None
  See application file for complete search history.

(56) References Cited

U.S. PATENT DOCUMENTS 7,884,662 B1 2/2011 Chuang
9,557,853 B2 * 1/2017 Noto ...................... G06F 3/0418
(Continued)

FOREIGN PATENT DOCUMENTS

CN 101436858 A 5/2009
CN 102072739 A 5/2011
(Continued)

OTHER PUBLICATIONS

K. Kanimozhi; R. Pandlan; J. Booma, Effects of RFI in Switched Capacitor Circuits, <2008 10th International Conference on Electromagnetic Interference & Compatibility>, IEEE, India, pp. 1-7, Jul. 6, 2009.

(Continued)

*Primary Examiner* — Benjamin C Lee
*Assistant Examiner* — Emily J Frank
(74) *Attorney, Agent, or Firm* — Winston Hsu

(57) ABSTRACT

The present disclosure is applied to touch technology, and provides an integrating circuit. The integrating circuit comprises an impedance unit, an amplifier, an integration capacitor, a discharge capacitor, a first switch and a second switch. The amplifier comprises a first input terminal, a second input terminal and an output terminal configured to output an output signal; the integration capacitor is coupled between the first input terminal and the output terminal; the first switch is coupled between the first input terminal of the amplifier and the second terminal of the discharge capacitor; and the second switch is coupled between the first terminal and the second terminal of the discharge capacitor.

20 Claims, 4 Drawing Sheets

(56) References Cited

U.S. PATENT DOCUMENTS

| | | |
|---|---|---|
| 2011/0163768 A1 | 7/2011 | Kwon |
| 2011/0242048 A1 | 10/2011 | Guedon |
| 2012/0039098 A1* | 2/2012 | Berghegger ...... H02M 3/33507 |
| | | 363/21.13 |
| 2012/0043971 A1* | 2/2012 | Maharyta ............. H03K 17/962 |
| | | 324/658 |
| 2012/0161846 A1 | 6/2012 | Ningrat |
| 2013/0088301 A1* | 4/2013 | Kamp .................... H03K 4/502 |
| | | 331/45 |
| 2013/0088444 A1 | 4/2013 | Kim |
| 2014/0085235 A1* | 3/2014 | Tokita ................... G06F 3/0412 |
| | | 345/173 |
| 2014/0085252 A1* | 3/2014 | Hanssen ............ G01R 27/2605 |
| | | 345/174 |
| 2014/0225858 A1 | 8/2014 | Jo |
| 2015/0161954 A1* | 6/2015 | Tokita ................... G06F 3/0412 |
| | | 345/174 |
| 2015/0180493 A1* | 6/2015 | Liu ......................... H02M 3/06 |
| | | 324/686 |
| 2015/0212650 A1* | 7/2015 | Noto .................... G01R 35/005 |
| | | 345/174 |
| 2015/0268758 A1 | 9/2015 | Lo |
| 2015/0338989 A1 | 11/2015 | Noto |
| 2016/0378252 A1 | 12/2016 | Jeong |

FOREIGN PATENT DOCUMENTS

| | | |
|---|---|---|
| CN | 102207804 A | 10/2011 |
| CN | 102750057 A | 10/2012 |
| CN | 102968236 A | 3/2013 |
| CN | 103034364 A | 4/2013 |
| CN | 103097994 A | 5/2013 |
| CN | 103294297 A | 9/2013 |
| CN | 103577015 A | 2/2014 |
| CN | 103676272 A | 3/2014 |
| CN | 103713784 A | 4/2014 |
| CN | 103837163 A | 6/2014 |
| CN | 103902123 A | 7/2014 |
| CN | 104009625 A | 8/2014 |
| CN | 104020914 A | 9/2014 |
| CN | 104348448 A | 2/2015 |
| CN | 104615315 A | 5/2015 |
| CN | 104731425 A | 6/2015 |
| CN | 104808880 A | 7/2015 |
| CN | 104932762 A | 9/2015 |
| CN | 105046194 A | 11/2015 |
| CN | 105099426 A | 11/2015 |
| EP | 0 047 409 A2 | 3/1982 |
| JP | 2015-141556 A | 8/2015 |
| KR | 10-2015-0001489 A | 1/2015 |
| WO | 2014/208897 A1 | 12/2014 |
| WO | WO-2015115873 A1 * | 8/2015 ............ G06F 3/044 |

OTHER PUBLICATIONS

Caolong Zhang, <The Research and Design of Capacitive Level Meter Signal Conversion Circuit>, <Master Thesis>, <University of Electronic Science and Technology of China>, China, 2013.

\* cited by examiner

INTEGRATING CIRCUIT AND CAPACITANCE SENSING CIRCUIT

CROSS REFERENCE TO RELATED APPLICATIONS

The present application is a continuation of international application No. PCT/CN2016/113974 filed on Dec. 30, 2016, which claims the priority to Chinese Patent Application No. 201511031728.1, filed on Dec. 31, 2015, both of which are hereby incorporated by reference in their entireties.

BACKGROUND OF THE INVENTION

1. Field of the Invention

The present disclosure is applied to touch technology, and more particularly, is related to an integrating circuit and a capacitance sensing circuit capable of sensing a variation of capacitance effectively.

2. Description of the Prior Art

As technology continuously grows, interface of electronic product is more and more convenient. For example, through touch panel, a user may use a finger or stylus to operate on the screen panel and to input information/text/pattern, so as to spare an effort using input devices such as a keyboard or keys. In fact, the touch panel usually includes a sensing panel and a display device disposed behind the sensing panel. The electronic device would determine the meaning of each touch action according to the touching location on the sensing panel and the picture (s) displayed by the display device at the time, and perform operations correspondingly.

Capacitance touch-control technology performs sensing the capacitance variation of a detection capacitor within a detection circuit to determine the meaning of the touch action. Current capacitance touch-control technology may be classified as self-capacitance touch-control and mutual-capacitance touch-control. The capacitance sensing circuit within the self-capacitance touch-control panel or the mutual-capacitance touch-control panel may convert the capacitance of the detection capacitor as an analog output signal, and an analog-to-digital convertor (ADC) is utilized to convert the analog output signal into a digital signal, for a back-end capacitance determining circuit to determine the capacitance. However, either in the self-capacitance touch-control panel or in the mutual-capacitance touch-control panel, the capacitance variation thereof is quite small, such that a signal component caused by the capacitance variant within the analog output signal is correspondingly small. From another perspective, the analog output signal may include a fixed signal and a variation signal, where the variation signal within the analog output signal is caused by the capacitance variant. The capacitance sensing circuit would determine the capacitance variation of the detection capacitor according to the variation signal within the analog output signal. In other words, the variant signal is critical in capacitance sensing. In order to correctly determine the capacitance variation of the detection capacitor, the ADC with a large dynamic range and a high resolution is utilized to resolve the analog output signal, causing larger circuit complexity and increase of production cost. In another perspective, the large dynamic range and the high resolution of the ADC are mostly occupied by the fixed signal within the analog out signal, such that the critical variation signal in capacitance sensing is not able to be effectively resolved. Therefore, it is necessary to improve the related art.

SUMMARY OF THE INVENTION

The technical problem to be solved by the present disclosure is to provide an integrating circuit, to sense capacitance effectively.

In order to solve the above technical problem, the present disclosure provides an integrating circuit, including:
  an impedance unit;
  an amplifier, including:
    a first input terminal, coupled to the impedance unit;
    a second input terminal; and
    an output terminal, configured to output an output signal;
  an integration capacitor, coupled between the first input terminal and the output terminal;
  a discharge capacitor, including:
    a first terminal, configured to receive a first voltage; and
    a second terminal;
  a first switch, coupled between the first input terminal of the amplifier and the second terminal of the discharge capacitor; and
  a second switch, coupled between the first terminal and the second terminal of the discharge capacitor.

In order to solve the above technical problem, the present disclosure provides a capacitance sensing circuit configured to sense a detection capacitance of an detection circuit, including:
  a first analog-to-digital convertor (ADC), configured to generate a first digital signal;
  a capacitance determining circuit, coupled to the first ADC, configured to determine a capacitance variation of the detection capacitance according to the first digital signal; and
  a first integrating circuit, coupled between the detection circuit and the first ADC, the first integrating circuit including:
    an first amplifier, including:
      a first input terminal;
      a second input terminal; and
      an output terminal, configured to output a first output signal to the first ADC;
    a first integration capacitor, coupled between the first input terminal and the output terminal of the first amplifier;
    a first discharge capacitor, including:
      a first terminal, configured to receive a first voltage; and
      a second terminal;
    a first switch, coupled between the first input terminal of the first amplifier and the second terminal of the discharge capacitor; and
    a second switch, coupled between the first terminal and the second terminal of the discharge capacitor.

The integrating circuit provided in the embodiment of the present disclosure utilizes the discharge capacitor and the switch couple to the discharge capacitor to limit the output signal between the maximum voltage and the minimum voltage. In this regard, even after the integrating circuit integrates for a long time, the total integrating voltage may be much larger than the dynamic range of the ADC, without causing the ADC entering into the saturation status. Therefore, the integrating circuit and the capacitance sensing circuit of the present disclosure may lower the requirement of the dynamic range of the ADC, further reduce the circuit complexity and production cost, and sense the capacitance variant effectively. For ADC with a specific accuracy, the present disclosure may enhance the accuracy of the capacitance sensing circuit and enhance the SNR (signal to noise ratio) of the system. In addition, since the discharge capacitor may effectively reduce the maximum voltage of integration, relatively small capacitor may be used as the integration capacitor within the integrating circuit, such that the circuit area is reduced.

These and other objectives of the present invention will no doubt become obvious to those of ordinary skill in the art after reading the following detailed description of the preferred embodiment that is illustrated in the various figures and drawings.

DETAILED DESCRIPTION

In order to make the objects, technical solutions and advantages of the present disclosure become more apparent, the following relies on the accompanying drawings and embodiments to describe the present disclosure in further detail. It should be understood that the specific embodiments described herein are only for explaining the present disclosure and are not intended to limit the present disclosure.

Figure 1:
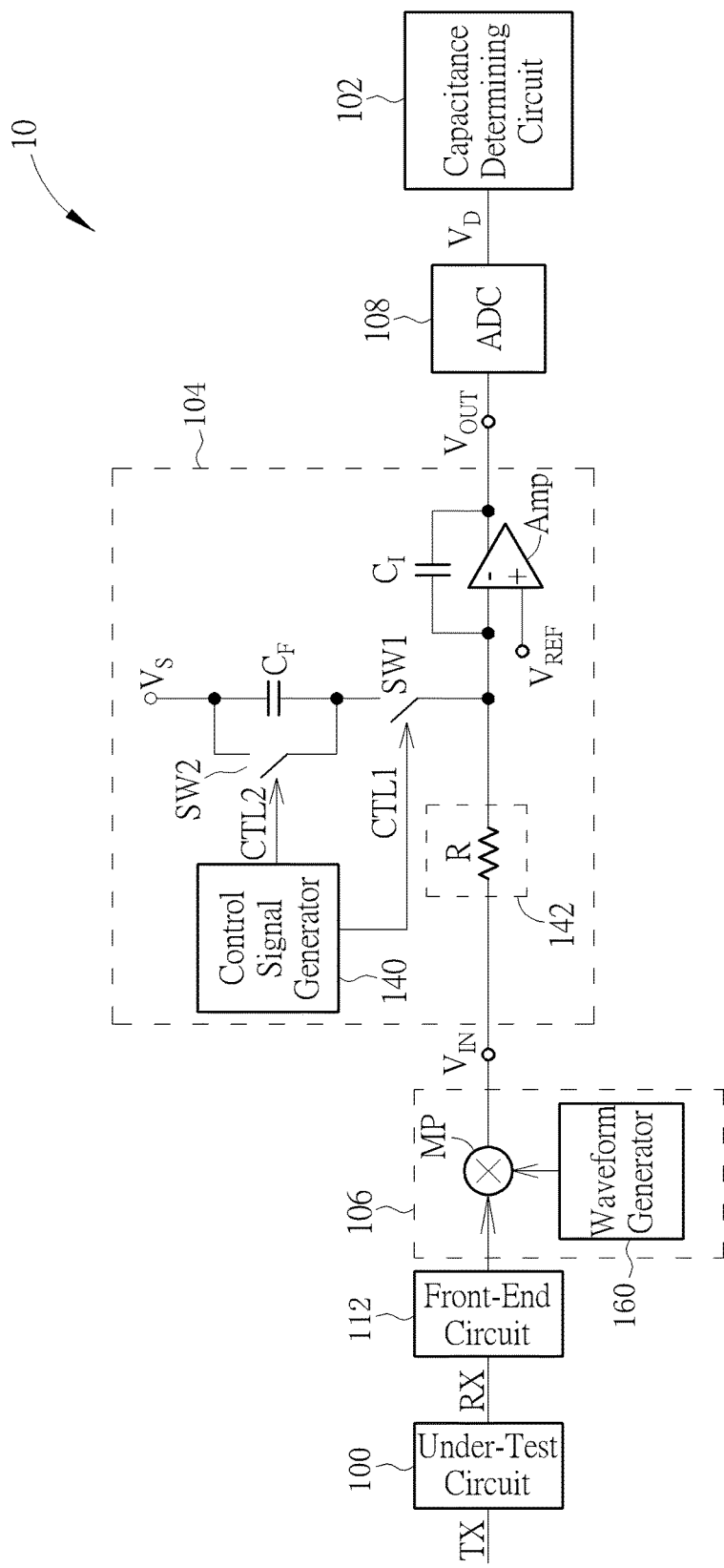
FIG. 1 is a schematic diagram of a capacitance sensing circuit according to an embodiment of the present disclosure.

Please refer to FIG. 1, which is a schematic diagram of a capacitance sensing circuit 10 according to an embodiment of the present disclosure. The capacitance sensing circuit 10 applies a signal TX to a detection circuit 100, and receives a signal RX from the detection circuit 100. The capacitance sensing circuit 10 senses an detection capacitance CUT of the detection circuit 100 according to the signal TX and the signal RX.

The capacitance sensing circuit 10 includes an integrating circuit 104, an analog-to-digital convertor (ADC) 108, a capacitance determining circuit 102, a front-end circuit 112 and a mixer 106. The mixer 106 is coupled between the detection circuit 100 and the integrating circuit 104, and the mixer 106 includes a multiplier MP and a waveform generator 160. The mixer 106 inputs an input signal VIN to the integrating circuit 104. The integrating circuit 104 generates an output signal VOUT according to the input signal VIN. The ADC 108, coupled to the integrating circuit 104, is configured to convert the output signal VOUT as/into a digital signal VD. The capacitance determining circuit 102, coupled to the ADC 108, is configured to determine a capacitance variation of the detection capacitance CUT according to the digital signal VD.

The front-end circuit 112 includes an amplifier and a filter including active circuit components. The front-end circuit 112 may adjust a magnitude of the signal RX by adjusting a gain of the amplifier, such that the signal RX would not surpass an operational range of the components of the back-end circuit. The filter is configured to filter out noise. In general, the front-end circuit 112 may flexibly perform filtering and amplifying operation over noise and interference signals, so as to enhance a resistance of the capacitance sensing circuit 10 against noise and further to enhance a signal-to-noise ratio (SNR) of the capacitance sensing circuit 10. In addition, the front-end circuit 112 including the active components also enhances a driving capability of the circuit, and lowers an influence of the back-end circuit to the front-end detection circuit 100. In the related art, since passive components are used to obtain charges stored in the detection capacitor by charge-transferring or charge-sharing, which requires another capacitor comparable to or even larger than the detection capacitor, such that circuit area thereof is increased. Including active components may adjust signal magnitudes, such that there is no need for the back-end capacitor to be matched up with the detection capacitor, and the circuit area is therefore reduced.

The integrating circuit 104 includes: an amplifier Amp, an integration capacitor CI, a discharge capacitor CF, an impedance unit 142, a control signal generator 140 and switches SW1, SW2. The amplifier Amp includes a negative input terminal (i.e., first input terminal, denoted as "−"), a positive input terminal (i.e., second input terminal, denoted as "+") and an output terminal. The positive input terminal of the amplifier Amp receives a reference voltage VREF. The output terminal is configured to output the output signal VOUT. The impedance unit 142 may include a resistor R. A terminal of the resistor R is coupled to the negative input terminal of the amplifier Amp, and another terminal receives the input signal VIN. The resistor R is configured to adjust the integration/filtering characteristic of the integrating circuit 104, and a ratio/gain between the input signal VIN and the output signal VOUT, such that the output signal VOUT may lie in a dynamic range of the ADC 108 correctly. The integration capacitor CI is coupled between the negative input terminal and the output terminal of the amplifier Amp. A first terminal of the discharge capacitor CF is configured to receive a voltage VS, and a second terminal is coupled to the switch SW1, wherein the voltage VS is smaller than the reference voltage VREF. The switch SW1 is coupled between the negative input terminal of the amplifier Amp and the second terminal of the discharge capacitor CF. The switch SW2 is coupled between the first terminal and the second terminal of the discharge capacitor CF. The switches SW1 and SW2 are controlled by the control signal generator 140, which means that the control signal generator 140 generates control signals CTL1 and CTL2, to control a conduction status of the switches SW1 and SW2, respectively.

Operation principles of the capacitance sensing circuit 10 and the integrating circuit 104 are described as followed. In a first stage T1, the control signal generator 140 generates the control signal CTL1 to cutoff the switch SW1. At this time, the integrating circuit 104 continuously integrates the input signal VIN, i.e., electronic charges are continuously accumulated in the integration capacitor CI, and the output signal VOUT continuously decreases. In addition, at a period of time during the first stage T1, the control signal generator 140 generates the control signal CTL2 to conduct the switch SW2, the discharge capacitor CF stores no charge since the switch SW2 is conducted. In a second stage T2, the control signal generator 140 generates the control signals CTL1 and CTL2 to conduct the switch SW1 and cutoff the switch SW2. At this time, since the voltage VS is smaller than the reference voltage VREF, the electronic charges accumulated in the integration capacitor CI would be released toward the discharge capacitor CF, i.e., charging the discharge capacitor CF. When the discharge capacitor CF is charged and saturated, the integration of the input signal VIN continues. Since the integration capacitor CI is coupled to the negative input terminal of the amplifier Amp, when the electronic charges stored in the integration capacitor CI are released to the discharge capacitor CF, the output signal VOUT would be pulled up immediately, until the discharge capacitor CF is charged to be saturated, where the output signal VOUT is pulled up by an amount of $$\frac{C_F}{C_I}(V_{REF} - V_S).$$

After the discharge capacitor CF is charged to be saturated, the output signal VOUT continues decreasing since the integrating circuit 104 integrates the input signal VIN.

Figure 2:
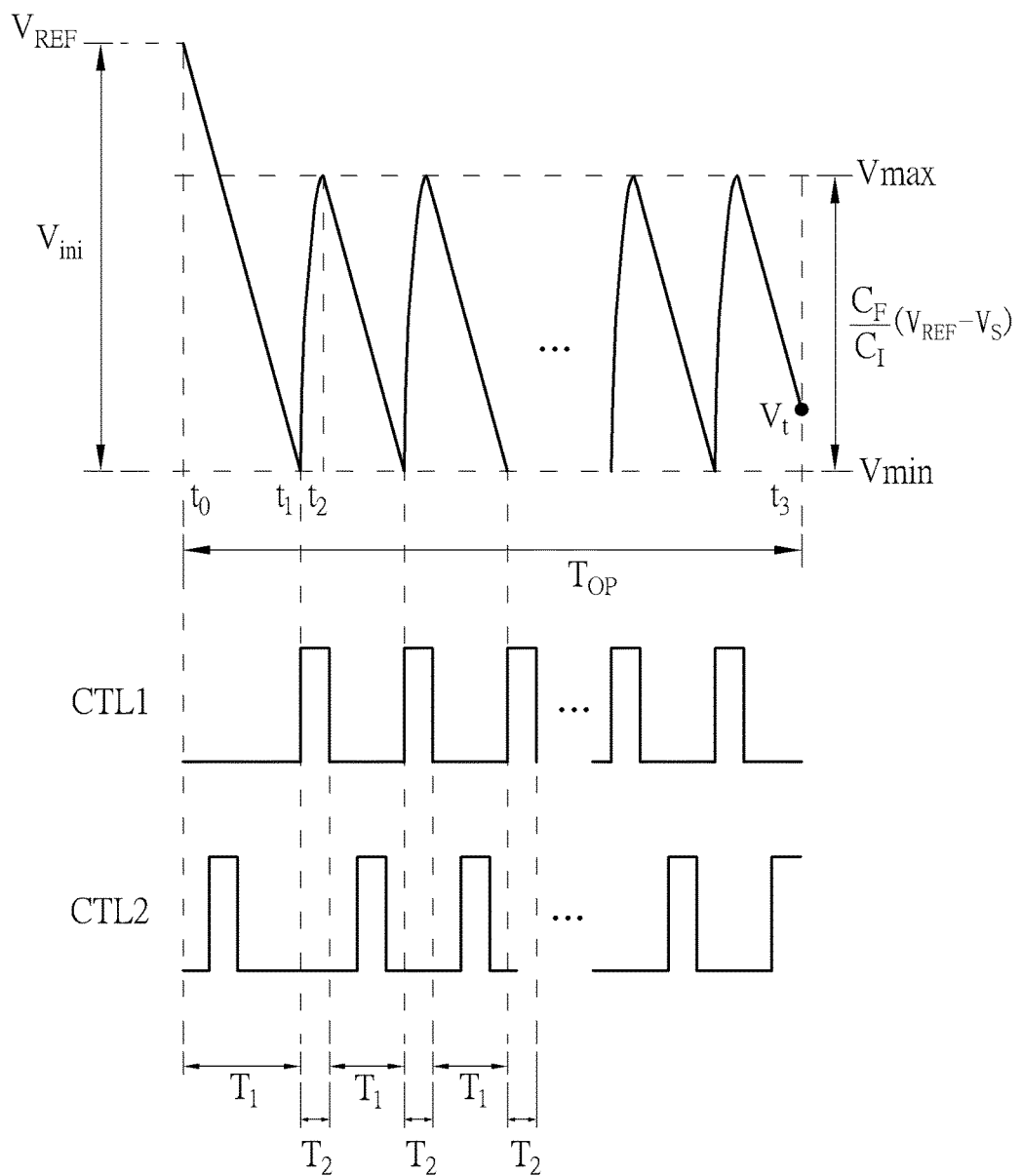
FIG. 2 illustrates a plurality of waveforms of an embodiment of the present disclosure.

Specifically, please refer to FIG. 2, which illustrates waveforms of the output signal VOUT and the control signals CTL1, CTL2 varying with respect to time. When the control signals CTL1, CTL2 are high voltage, the switches SW1, SW2 are conducted/ON. When the control signals CTL1, CTL2 are low voltage, the switches SW1, SW2 are cutoff/OFF. The integrating circuit 104 starts to operate at a time t0, and the output signal VOUT at this time is the voltage VREF. After the integrating circuit 104 starts to operate, the control signal generator 140 controls the switches SW1, SW2 such that the integrating circuit 104 firstly enters into the first stage T1. In the first stage T1, the integrating circuit 104 clears electronic charges in the discharge capacitor CF. The integrating circuit 104 continues integrating the input signal VIN, the integration capacitor CI continues accumulating electronic charges, and the output signal VOUT continues decreasing. At a time t1, the control signal generator 140 controls the switches SW1, SW2 such that the integrating circuit 104 firstly enters into the second stage T2. In the second stage T2, the electronic charges accumulated in the integration capacitor CI are released to the discharge capacitor CF, such that the output signal VOUT is pulled up until the discharge capacitor CF is charged to be saturated (corresponding to a time t2). After the time t2, the control signal generator 140 may control the switch SW1 such that the integrating circuit 104 secondly enters into the first stage T1, in which the integrating circuit 104 continues integrating the input signal VIN, and the output signal VOUT continues decreasing. During the time the integrating circuit 104 integrating the input signal VIN, the control signal generator 140 may control the switch SW2 to clear the electronic charges within the discharge capacitor CF. The control signal generator 140 periodically controls the switch SW1 such that the integrating circuit 104 operates back and forth between the first stage T1 and the second stage T2. Every time in the first stage T1, the control signal generator 140 controls the switch SW2 to clear the electronic charges within the discharge capacitor CF. Until a time t3, a signal value of the output signal VOUT is a voltage Vt. A number of times of the integrating circuit 104 entering the second stage T2 within an operating time period TOP (where the operating time period TOP is referred to a time period from the time t0 to the time t3) is N times. That is, during the operating time period TOP, the integrating circuit 104 enters into the second stage T2 by N times. Moreover, the control signal generator 140 may periodically control the integrating circuit 104 to operate back and forth between the first stage T1 and the second stage T2 according to a clock signal. In addition, a voltage Vini represents a decrease amount of the output signal VOUT from the integrating circuit 104 starting to operate until firstly entering into the second stage T2, due to integration.

As can be seen from FIG. 2, after firstly entering into the second stage T2, the output signal VOUT varies between a maximum voltage Vmax and a minimum voltage Vmin, where a voltage difference between the maximum voltage Vmax and the minimum voltage Vmin is $$\frac{C_F}{C_I}(V_{REF} - V_S),$$

and a total integrating voltage VO of the integrating circuit 104 from the time t0 to the time t3 is $$V_O = V_{REF} - V_{ini} - N\frac{C_F}{C_I}(V_{REF} - V_S) - V_t$$

(which means that a total integrating electronic charges accumulated in the integration capacitor CI between the time t0 and the time t3 is CI(VO−VREF)).

In order to sense a capacitance variation of the detection capacitance CUT, the capacitance sensing circuit 10 may utilize the integrating circuit 104 to perform the above operations in a first time, and obtains a first total integrating voltage VO1 as $$V_{O1} = V_{REF} - V_{ini} - N_1\frac{C_F}{C_I}(V_{REF} - V_S) - V_{t1}.$$

The capacitance sensing circuit 10 may further utilize the integrating circuit 104 to perform the above operations again in a second time, and obtains a second total integrating voltage VO2 as $$V_{O2} = V_{REF} - V_{ini} - N_2\frac{C_F}{C_I}(V_{REF} - V_S) - V_{t2}.$$

Voltages Vt1 and Vt2 in the above are voltage values of the output signal VOUT after the integrating circuit 104 integrates for the operating time period TOP in the first time and the second time, respectively, and the number of times N1 and the number of times N2 are the number of times of the integrating circuit 104 entering the second stage T2 during the operating time period TOP at the first time and the second time, respectively.

Notably, the capacitance variation of the detection capacitance CUT is related to a voltage difference VDIFF between the first total integrating voltage VO1 and the second total integrating voltage VO2, and the voltage difference VDIFF is $$V_{DIFF} = V_{O2} - V_{O1} = (N_1 - N_2)\frac{C_F}{C_I}(V_{REF} - V_S) + V_{t1} - V_{t2}.$$

In other words, the capacitance variation of the detection capacitance CUT is only related to the number of times N1, the number of times N2, the voltage Vt1 and the voltage Vt2. If it is properly designed such that the number of times N1 and the number of times N2 are the same, the voltage difference VDIFF is only related to the voltage Vt1 and the voltage Vt2, i.e., the capacitance variation of the detection capacitance CUT is only related to the voltage Vt1 and the voltage Vt2. In addition, the voltage Vt1 and the voltage Vt2 is within a range between the maximum voltage Vmax and the minimum voltage Vmin. In other words, a dynamic range of the ADC 108 is only required to be between the maximum voltage Vmax and the minimum voltage Vmin, which lower a requirement of the dynamic range of the ADC 108.

As can be seen, the embodiment of the present disclosure utilizes the integrating circuit 104 to limit the output signal VOUT between the maximum voltage Vmax and the minimum voltage Vmin. Even after the integrating circuit 104 integrates for the operating time period TOP, the total integrating voltage VO may be much larger than the dynamic range of the ADC 108, without causing the ADC 108 entering into a saturation status. Compared to the related art, the present disclosure may lower the requirement of the dynamic range of the ADC 108, and further reduce the circuit complexity and production cost. For ADC with a specific accuracy, the present disclosure may enhance the accuracy of the capacitance sensing circuit and the SNR of the system. In addition, since the discharge capacitor may effectively reduce a maximum voltage of integration, a relatively small capacitor may be used as the integration capacitor CI within the integrating circuit 104, such that the circuit area is reduced.

Notably, the embodiments stated in the above are utilized for illustrating the concept of the present disclosure. Those skilled in the art may make modifications and alterations accordingly, and not limited herein. For example, the control signal generator 140 is not limited to control the integrating circuit 104 according to the clock signal to operate back and forth between the first stage T1 and the second stage, the control signal generator 140 may generate the control signals CTL1 and CTL2 according to the output signal VOUT. For example, when the output signal VOUT is lower than the minimum voltage Vmin, the control signal generator 140 generates the control signals CTL1 and CTL2, such that the integrating circuit 104 enters into the second stage T2, so as to charge the discharge capacitor CF and pull up the output signal VOUT.

Figure 3:
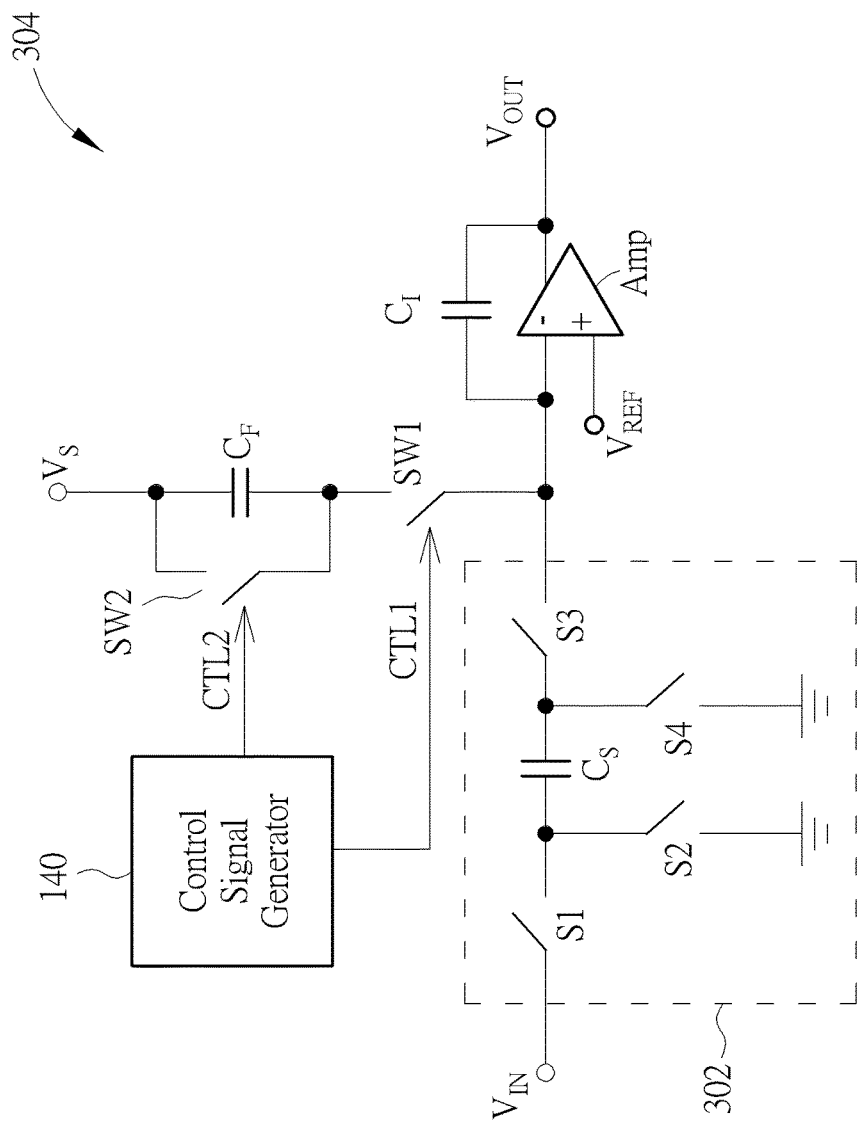
FIG. 3 is a schematic diagram of an integrating circuit according to an embodiment of the present disclosure.

In addition, the resistor R in the integrating circuit 104 is used to adjust a ratio between the input signal VIN and the output signal VOUT, which is not limited thereto. A switched-capacitor module may further be utilized to adjust the ratio between the input signal VIN and the output signal VOUT, i.e., the resistor R in the integrating circuit 104 may be replaced with the switched-capacitor module. For example, please refer to FIG. 3, which is a schematic diagram of an integrating circuit 304 according to an embodiment of the present disclosure. The integrating circuit 304 is similar to the integrating circuit 104, and thus, the same components are denoted by the same notations. Different from the integrating circuit 104, the integrating circuit 304 includes an impedance unit, and the impedance unit includes a switched-capacitor module 302, a terminal of the switched-capacitor module 302 is coupled to the negative input terminal of the amplifier Amp, another terminal is configured to receive the input signal VIN.

The switched-capacitor module 302 includes a capacitor CS and switches S1, S2, S3, S4. The switch S1 are coupled to a first terminal of the capacitor CS, configured to receive the input signal VIN. The switch S2 is coupled between the first terminal of the capacitor CS and the ground. The switch S3 is coupled between a second terminal of the capacitor CS and the negative input terminal of the amplifier Amp. The switch S4 is coupled between the second terminal of the capacitor CS and the ground. The switches S1, S2, S3 and S4 may be controlled by clock control signals ph1 and ph2, where the clock control signals ph1 and ph2 are mutually orthogonal (i.e., the time of the clock control signals ph1 and ph2 being high voltage are not mutually overlapped). Specifically, in one embodiment, the clock control signal ph1 may be used to control the conduction status of the switches S1 and S3, and the clock control signal ph2 may be used to control the conduction status of the switches S2 and S4. In another embodiment, the clock control signal ph1 may be used to control the conduction status of the switches S1 and S4, and the clock control signal ph2 may be used to control the conduction status of the switches S2 and S3. As long as the switched-capacitor module 302 is utilized to adjust the ratio between the input signal VIN and the output signal VOUT, and the clock control signals ph1 and ph2, which are the mutually orthogonal, are utilized to control the conduction status of the switches S1, S2, S3 and S4, it is within the scope of the present disclosure.

Figure 4:
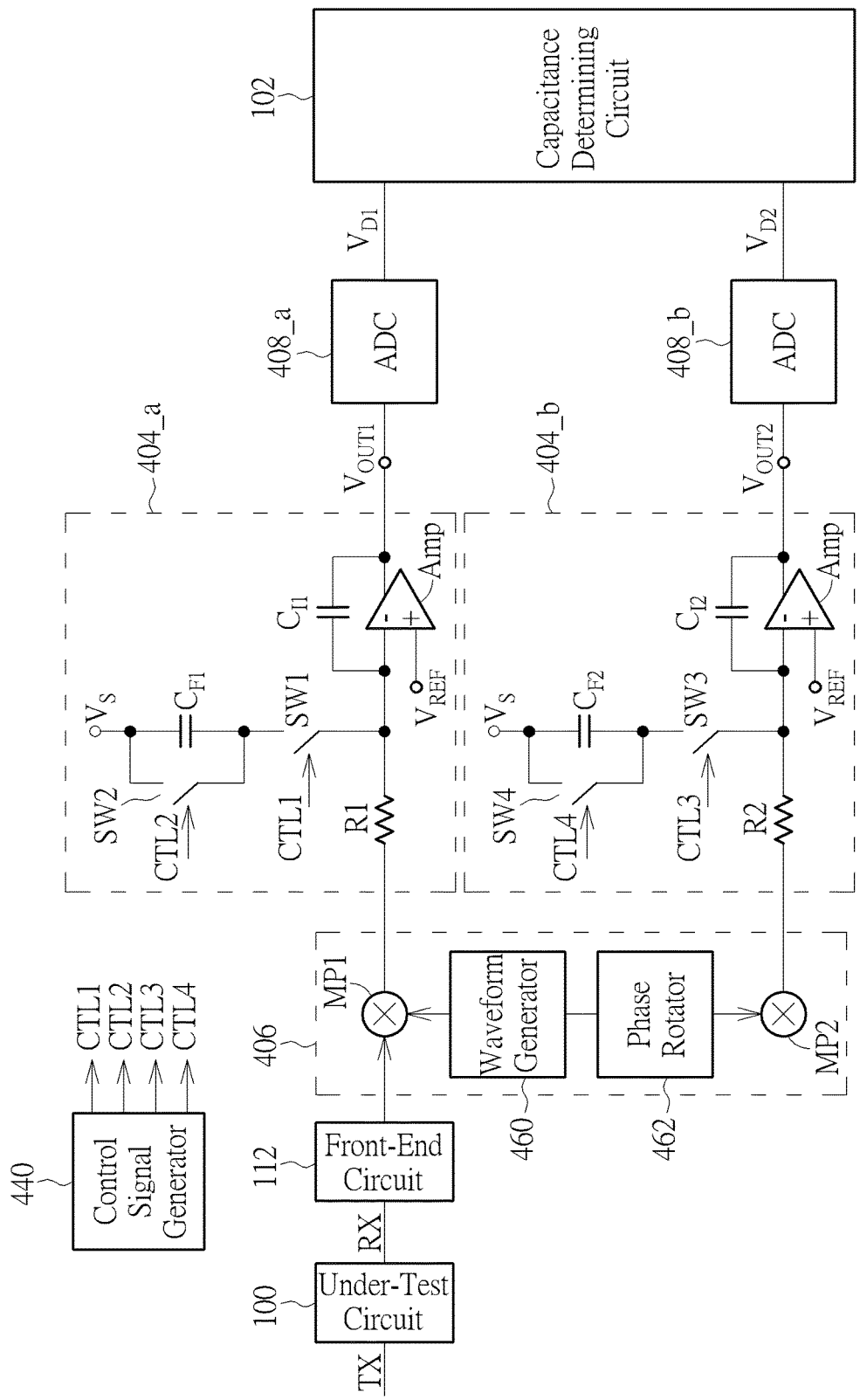
FIG. 4 is a schematic diagram of a capacitance sensing circuit according to another embodiment of the present disclosure.

In addition, the capacitance sensing circuit 10 only integrates the in-phase component of the signal RX, which is not limited thereto. The capacitance sensing circuit 10 may integrate the in-phase component as well as the quadrature component of the signal RX at the same time, so as to sense the detection capacitance CUT more accurately. For example, please refer to FIG. 4, which is a schematic diagram of a capacitance sensing circuit 40 according to another embodiment of the present disclosure. The capacitance sensing circuit 40 is similar to the capacitance sensing circuit 10, and thus, the same components are denoted by the same notations. Similar to the capacitance sensing circuit 10, the capacitance sensing circuit 40 utilizes an integrating circuit 404_a to integrate the in-phase component of the signal RX. Different from the capacitance sensing circuit 10, the capacitance sensing circuit 40 utilizes a phase rotator 462 and a multiplier MP2 included in a mixer 406 to extract the quadrature component of the signal RX, and utilizes an integrating circuit 404_b to integrate the quadrature component of the signal RX. The integrating circuits 404_a and 404_b are coupled to ADCs 408_a and 408_b, respectively. The ADCs 408_a and 408_b are configured to convert the output signal VOUT1 and VOUT2 generated by the integrating circuits 404_a and 404_b as digital signals VD1 and VD2, respectively. The capacitance determining circuit 102 may determine the capacitance variation of the detection capacitance CUT according to the digital signals VD1 and VD2, such that the capacitance is sensed more accurately.

In addition, a control signal generator 440 generates the control signals CTL1, CTL2, CTL3 and CTL4, to control the conduction status of the switches SW1, SW2, SW3 and SW4, respectively. The mechanism controlling the conduction status may be referred to the paragraphs stated in the above, which is not narrated herein. Notably, in FIG. 4, the integrating circuits 404_a and 404_b have the circuit structure which is the same as the integrating circuit 104, which is not limited thereto. The integrating circuits of the current embodiment may be have the circuit structure which is the same as the integrating circuit 304 (i.e., the resistors R1 and R2 in the integrating circuits 404_a and 404_b are replaced by the switched-capacitor module 302), which is also within the scope of the present disclosure.

As can be seen, the integrating circuit and the capacitance sensing circuit in the embodiment of the present disclosure utilize the discharge capacitor and the switch couple to the discharge capacitor to limit the output signal between the maximum voltage and the minimum voltage. In this regard, even after the integrating circuit integrates for a long time, the total integrating voltage may be much larger than the dynamic range of the ADC, without causing the ADC entering into the saturation status. Therefore, the integrating circuit and the capacitance sensing circuit of the present disclosure may lower the requirement of the dynamic range of the ADC, and further reduce the circuit complexity and production cost. For ADC with a specific accuracy, the present disclosure may enhance the accuracy of the capacitance sensing circuit and the SNR of the system. In addition, since the discharge capacitor may effectively reduce the maximum voltage of integration, relatively small capacitor may be used as the integration capacitor within the integrating circuit, such that the circuit area is reduced.

The foregoing is only preferred embodiments of the present disclosure, it is not intended to limit the present disclosure, any modifications within the spirit and principles of the present disclosure made, equivalent replacement and improvement, etc., should be included in this within the scope of the disclosure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrating circuit in a touch input capacitance sensing circuit to limit dynamic range requirement from capacitance variation, comprising:
    an impedance unit receiving a touch input voltage;
    an amplifier, comprising:
        a first input terminal, coupled to the output of the impedance unit;
        a second input terminal; and
        an output terminal, configured to output an output signal;
    an integration capacitor, coupled between the first input terminal and the output terminal;
    a discharge capacitor, comprising:
        a first terminal, configured to receive a first voltage; and
        a second terminal;
    a first switch, coupled between the first input terminal of the amplifier and the second terminal of the discharge capacitor; and
    a second switch, coupled between the first terminal and the second terminal of the discharge capacitor;
    wherein the integrating circuit performs an integrating operation on an input signal when the first switch is cut off;
    wherein during a time in which an electric current flows through the integration capacitor, no current flows through the discharge capacitor.

2. The integrating circuit of claim 1, further comprising:
    a control signal generator, configured to generate a first control signal and a second control signal, so as to control a conduction status of the first switch and the second switch.

3. The integrating circuit of claim 2, wherein the control signal generator generates the first control signal and the second control signal according to a frequency signal or the output signal.

4. The integrating circuit of claim 1, wherein the second terminal of the amplifier receives a reference voltage, and the first voltage is smaller than the reference voltage.

5. The integrating circuit of claim 1, wherein the impedance unit comprises a resistor, a terminal of the resistor is coupled to the first input terminal of the amplifier, and another terminal of the resistor is configured to receive the input signal.

6. The integrating circuit of claim 1, wherein the impedance unit comprises a switched capacitor module, a terminal of the switched capacitor module is coupled to the first input terminal of the amplifier, and another terminal of the switched capacitor module is configured to receive the input signal.

7. The integrating circuit of claim 6, wherein the switched capacitor module comprises:
    a first switching capacitor, a third switch, a fourth switch, a fifth switch and a sixth switch;
    wherein the third switch and the fourth switch are coupled to a first terminal of the first switching capacitor, the fifth switch and the sixth switch are coupled to a second terminal of the first switching capacitor, the third switch receives the input signal, the fifth switch is coupled to the first input terminal of the amplifier, and the fourth switch and the sixth switch are coupled to a ground terminal.

8. A touch input capacitance sensing circuit, configured to sense a touch input detection capacitance of a touch input detection circuit, comprising:
    a front-end circuit, coupled to the detection circuit, comprising at least one active component;
    a first analog-to-digital convertor (ADC), configured to generate a first digital signal;
    a capacitance determining circuit, coupled to the first ADC, configured to determine a capacitance variation of the detection capacitance according to the first digital signal; and
    a first integrating circuit, coupled between the detection circuit and the first ADC to limit dynamic range requirement of the first ADC from capacitance variation, wherein the first integrating circuit comprises:
        an impedance unit;
        a first amplifier, comprising:
            a first input terminal, coupled to the impedance unit;
            a second input terminal; and
            an output terminal, configured to output a first output signal to the first ADC;
        a first integration capacitor, coupled between the first input terminal and the output terminal of the first amplifier;
        a first discharge capacitor, comprising:
            a first terminal, configured to receive a first voltage; and
            a second terminal;
        a first switch, coupled between the first input terminal of the first amplifier and the second terminal of the discharge capacitor; and
        a second switch, coupled between the first terminal and the second terminal of the discharge capacitor;
    wherein the first integrating circuit performs an integrating operation on a first input signal of the first integrating circuit when the first switch is cut off;
    wherein during a time in which an electric current flows through the first integration capacitor, no current flows through the first discharge capacitor.

9. The capacitance sensing circuit of claim 8, wherein the first integrating circuit further comprises:
    a control signal generator, configured to generate a first control signal and a second control signal, so as to control a conduction status of the first switch and the second switch.

10. The capacitance sensing circuit of claim 9, wherein the control signal generator generates the first control signal and the second control signal according to a frequency signal or the first output signal.

11. The capacitance sensing circuit of claim 8, characterized by further comprising a mixer, coupled between the front-end circuit and the first integrating circuit.

12. The capacitance sensing circuit of claim 11, wherein the impedance unit comprises a first resistor, a terminal of the first resistor is coupled to the first input terminal of the first amplifier, and another terminal of the first resistor is coupled to the mixer.

13. The capacitance sensing circuit of claim 11, wherein the impedance unit comprises a first switched capacitor module, a terminal of the first switched capacitor module is coupled to the first input terminal of the first amplifier, and another terminal of the first switched capacitor module is coupled to the mixer.

14. The capacitance sensing circuit of claim 13, wherein the first switched capacitor module comprises a first switching capacitor, a third switch, a fourth switch, a fifth switch and a sixth switch;
wherein the third switch and the fourth switch are coupled to a first terminal of the first switching capacitor, the fifth switch and the sixth switch are coupled to a second terminal of the first switching capacitor, the third switch receives the first input signal, the fifth switch is coupled to the first input terminal of the first amplifier, and the fourth switch and the sixth switch are coupled to a ground terminal.

15. The capacitance sensing circuit of claim 11, wherein the mixer comprises a first multiplier and a waveform generator, the first multiplier is coupled between the detection circuit and the first integrating circuit, and the waveform generator is coupled to the first multiplier; the first input signal is an output of the first multiplier.

16. The capacitance sensing circuit of claim 15, wherein the mixer further comprises a phase rotator and a second multiplier, and the phase rotator is coupled between the waveform generator and the second multiplier.

17. The capacitance sensing circuit of claim 16, further comprising:
a second ADC, coupled to the capacitance determining circuit, configured to generate a second digital signal; and
a second integrating circuit, coupled between the second multiplier of the mixer and the second ADC, the second integrating circuit comprises:
a second amplifier, comprising:
a first input terminal;
a second input terminal; and
an output terminal, configured to output a second output signal to the second ADC;
a second integration capacitor, coupled between the first input terminal and the output terminal of the second amplifier;
a second discharge capacitor, comprising:
a first terminal, configured to receive the first voltage; and
a second terminal;
a seventh switch, coupled between the first input terminal of the second amplifier and the second terminal of the second discharge capacitor; and
an eighth switch, coupled between the first terminal and the second terminal of the second discharge capacitor;
wherein the second integrating circuit performs an integrating operation on a second input signal of the second integrating circuit when the seventh switch is cut off, and the second input signal is an output of the second multiplier;
wherein the capacitance determining circuit determines the capacitance variation of the detection capacitance according to the first digital signal and the second digital signal.

18. The capacitance sensing circuit of claim 17, wherein the control signal generator generates a third control signal and a fourth control signal to control a conduction status of the seventh switch and the eighth switch.

19. The capacitance sensing circuit of claim 18, wherein the control signal generator generates the third control signal and the fourth control signal according to the frequency signal or the second output signal.

20. The capacitance sensing circuit of claim 17, further comprising:
a second resistor, a terminal of the second resistor is coupled to the first input terminal of the second amplifier, and another terminal of the second resistor is coupled to the second multiplier of the mixer; and
a second switched capacitor module, a terminal of the second switched capacitor module is coupled to the first input terminal of the second amplifier, and another terminal of the second switched capacitor module is coupled to the second multiplier;
wherein the second switched capacitor module comprises a second switching capacitor, a ninth switch, a tenth switch, an eleventh switch and a twelfth switch;
the ninth switch and the tenth switch are coupled to a first terminal of the second switching capacitor, the eleventh switch and the twelfth switch are coupled to a second terminal of the second switching capacitor, the ninth switch receives the second input signal, the eleventh switch is coupled to the first input terminal of the second amplifier, and the tenth switch and the twelfth switch are coupled to a ground terminal.

* * * * *